(12) United States Patent
Jeong et al.

(10) Patent No.: US 12,324,316 B2
(45) Date of Patent: Jun. 3, 2025

(54) DISPLAY APPARATUS

(71) Applicant: LG Display Co., Ltd., Seoul (KR)

(72) Inventors: Song Yi Jeong, Seoul (KR); Ho Sung Kim, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 179 days.

(21) Appl. No.: 17/791,123

(22) PCT Filed: Sep. 3, 2021

(86) PCT No.: PCT/KR2021/011960
§ 371 (c)(1),
(2) Date: Jul. 6, 2022

(87) PCT Pub. No.: WO2022/124535
PCT Pub. Date: Jun. 16, 2022

(65) Prior Publication Data
US 2023/0329040 A1    Oct. 12, 2023

(30) Foreign Application Priority Data

Dec. 10, 2020   (KR) .......................... 10-2020-0172390

(51) Int. Cl.
*H10K 59/122*   (2023.01)
*H10K 50/16*    (2023.01)
(Continued)

(52) U.S. Cl.
CPC .......... *H10K 59/122* (2023.02); *H10K 50/16* (2023.02); *H10K 59/353* (2023.02);
(Continued)

(58) Field of Classification Search
CPC .... H10K 59/122; H10K 50/16; H10K 59/353; H10K 59/80521; H10K 59/352; H10K 2101/40; H10K 2101/30; H10K 2102/351
See application file for complete search history.

(56) References Cited

U.S. PATENT DOCUMENTS

| | | | |
|---|---|---|---|
| 2013/0140529 A1 | 6/2013 | Seong et al. | |
| 2016/0118449 A1* | 4/2016 | Sato ..................... | H10K 59/122 257/89 |

(Continued)

FOREIGN PATENT DOCUMENTS

| | | |
|---|---|---|
| KR | 10-2013-0061543 A | 6/2013 |
| KR | 10-2016-0066234 A | 6/2016 |

(Continued)

*Primary Examiner* — Joseph C. Nicely
*Assistant Examiner* — Alvin L Lee
(74) *Attorney, Agent, or Firm* — Birch, Stewart, Kolasch & Birch, LLP

(57) ABSTRACT

A display apparatus according to an embodiment of the present invention may include a substrate; a plurality of sub-pixels disposed on the substrate; a plurality of anodes disposed in the plurality of sub-pixels; a bank disposed to cover ends of the plurality of anodes; an organic layer disposed on the plurality of anodes and the bank; a cathode disposed on the organic layer; a first pattern disposed in the bank or on the bank so that the organic layer has a step; and a second pattern disposed between the organic layer and the cathode so that a step of the cathode is smaller than the step of the organic layer.

17 Claims, 9 Drawing Sheets

(51) Int. Cl.
  *H10K 59/35* (2023.01)
  *H10K 59/80* (2023.01)
  *H10K 101/40* (2023.01)

(52) U.S. Cl.
  CPC ..... *H10K 59/80521* (2023.02); *H10K 59/352* (2023.02); *H10K 2101/40* (2023.02)

(56) References Cited

U.S. PATENT DOCUMENTS

| | | |
|---|---|---|
| 2016/0155978 A1 | 6/2016 | Park |
| 2018/0061907 A1 | 3/2018 | Kim et al. |
| 2018/0062106 A1* | 3/2018 | Heo ............... H10K 50/805 |
| 2018/0190731 A1* | 7/2018 | Park ............... G09G 3/20 |
| 2019/0181202 A1 | 6/2019 | Lim et al. |

FOREIGN PATENT DOCUMENTS

| | | |
|---|---|---|
| KR | 10-2018-0025024 A | 3/2018 |
| KR | 10-2018-0079059 A | 7/2018 |
| KR | 10-2019-0068814 A | 6/2019 |
| KR | 10-2020-0072745 A | 6/2020 |

* cited by examiner

DISPLAY APPARATUS

CROSS REFERENCE TO RELATED APPLICATIONS

This application is the National Stage filing under 35 U.S.C. 371 of International Application No. PCT/KR2021/011960, filed on Sep. 3, 2021, which claims the benefit of earlier filing date and right of priority to Korean Application No. 10-2020-0172390, filed on Dec. 10, 2020, the contents of all these applications are hereby incorporated by reference herein in their entirety.

TECHNICAL FIELD

The present invention relates to a display apparatus, and more particularly, to a display apparatus capable of improving color mixing of light emitted from a plurality of light emitting elements and improving power consumption.

BACKGROUND ART

Currently, as it enters a full-scale information era, a field of a display device which visually expresses electrical information signals has been rapidly developed and studies are continued to improve performances of various display devices such as a thin-thickness, a light weight, and low power consumption.

Among these various display devices, an organic light emitting display device is a self-light emitting display device, and can be manufactured to be light and thin since it does not require a separate light source, unlike a liquid crystal display device having a separate light source. In addition, the organic light emitting display device has advantages in terms of power consumption due to a low voltage driving, and is excellent in terms of a color implementation, a response speed, a viewing angle, and a contrast ratio (CR), so that organic light emitting display devices have been studied as the next generation displays.

DISCLOSURE

Technical Problem

An object to be achieved by the present invention is to provide a display apparatus capable of minimizing a leakage current when the display apparatus is driven.

Another object to be achieved by the present invention is to provide a display apparatus capable of preventing an increase in power consumption of the display apparatus by minimizing resistance of a cathode.

Objects of the present disclosure are not limited to the above-mentioned objects, and other objects, which are not mentioned above, can be clearly understood by those skilled in the art from the following descriptions.

Technical Solution

In order to achieve the above aspects, a display apparatus according to an embodiment of the present invention may include a substrate; a plurality of sub-pixels disposed on the substrate; a plurality of anodes disposed in the plurality of sub-pixels; a bank disposed to cover ends of the plurality of anodes; an organic layer disposed on the plurality of anodes and the bank; a cathode disposed on the organic layer; a first pattern disposed in the bank or on the bank so that the organic layer has a step; and a second pattern disposed between the organic layer and the cathode so that a step of the cathode is smaller than the step of the organic layer.

In order to achieve the above aspects, a display apparatus according to another embodiment of the present invention may include a substrate on which a plurality of sub-pixels are disposed; a plurality of light emitting elements disposed in the plurality of sub-pixels and including an anode, an organic layer, and a cathode; a bank disposed between the plurality of sub-pixels; a first pattern disposed in the bank or on the bank and having an uppermost portion or a lowermost portion at a height different from that of an upper surface of the bank; and a second pattern disposed on the bank in a shape corresponding to the first pattern, wherein the organic layer and the cathode are disposed on the first pattern, wherein the second pattern is inserted between the organic layer and the cathode and configured to partially separate the organic layer and the cathode from each other.

Other detailed matters of the exemplary embodiments are included in the detailed description and the drawings.

Advantageous Effects

According to the present invention, a leak of a current through a common layer of a plurality of light emitting elements can be improved.

According to the present invention, it is possible to prevent an increase in resistance of a cathode as a path of the cathode increases or a width of the cathode decreases, and it is possible to prevent an increase in power consumption of a display apparatus.

The effects according to the present disclosure are not limited to the contents exemplified above, and more various effects are included in the present specification.

MODES OF THE INVENTION

Figure 1:
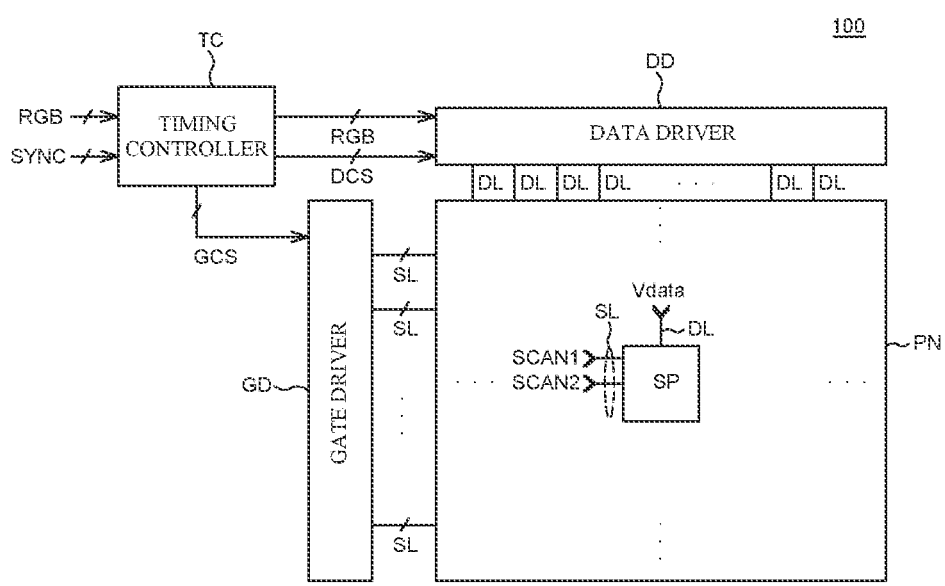
FIG. 1 is a schematic configuration diagram of a display apparatus according to an embodiment of the present invention.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a schematic configuration diagram of a display apparatus according to an embodiment of the present invention. In FIG. 1, only a display panel PN, a gate driver GD, a data driver DD, and a timing controller TC among various components of a display apparatus 100 are illustrated for convenience of explanation.

Referring to FIG. 1, the display apparatus 100 includes the display panel PN including a plurality of sub-pixels SP, the gate driver GD and the data driver DD for supplying various signals to the display panel PN, and the timing controller TC for controlling the gate driver GD and the data driver DD.

The gate driver GD supplies a plurality of scan signals to a plurality of scan lines SL according to a plurality of gate control signals GCS provided from the timing controller TC. The plurality of scan signals may include a first scan signal SCAN1 and a second scan signal SCAN2. Although it is illustrated in FIG. 1 that one gate driver GD is disposed to be spaced apart from one side of the display panel PN, the gate driver GD may be disposed in a gate in panel (GIP) manner, and the number and arrangement of gate drivers GD are not limited thereto.

The data driver DD converts image data RGB input from the timing controller TC into a data signal using a reference gamma voltage according to a plurality of data control signals DCS provided from the timing controller TC. In addition, the data driver DD may supply the converted data signal to a plurality of data lines DL.

The timing controller TC aligns image data RGB input from the outside and supplies it to the data driver DD. The timing controller TC may generate a gate control signal GCS and a data control signal DCS using synchronization signals SYNC input from the outside, for example, a dot clock signal, a data enable signal, and a horizontal/vertical synchronization signal. In addition, the timing controller TC may supply the generated gate control signal GCS and data control signal DCS to the gate driver GD and the data driver DD, respectively, to thereby control the gate driver GD and the data driver DD.

The display panel PN, a component for displaying an image to a user, includes the plurality of sub-pixels SP. In the display panel PN, the plurality of scan lines SL and the plurality of data lines DL cross each other, and each of the plurality of sub-pixels SP is connected to the scan line SL and the data line DL. In addition, although not illustrated in the drawings, each of the plurality of sub-pixels SP may be connected to a high potential power line, a low potential power line, an initialization signal line, an emission control signal line, and the like.

The plurality of sub-pixels SP are minimum units constituting a screen, and each of the plurality of sub-pixels SP includes a light emitting element and a pixel circuit for driving the light emitting element. A plurality of light emitting elements may be differently defined according to a type of the display panel PN. For example, when the display panel PN is an organic light emitting display panel, the light emitting element may be an organic light emitting element including an anode, an organic layer, and a cathode. In addition, a quantum dot light emitting diode (QLED) including a quantum dot (QD), or the like may be further used as the light emitting element. Hereinafter, a description will be made on the assumption that the light emitting element is an organic light emitting element, but a type of the light emitting element is not limited thereto.

The pixel circuit is a circuit for controlling driving of the light emitting element. The pixel circuit may be configured to include a plurality of transistors and a capacitor, but is not limited thereto.

Hereinafter, the pixel circuit of the sub-pixel SP will be described in more detail with reference to FIG. 2.

Figure 2:
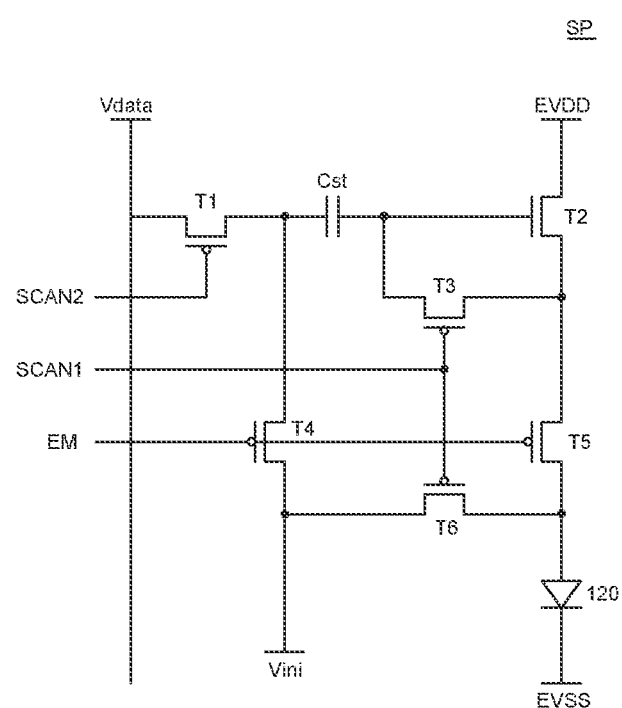
FIG. 2 is a circuit diagram of a sub-pixel of the display apparatus according to an embodiment of the present invention.

FIG. 2 is a circuit diagram of a sub-pixel of the display apparatus according to an embodiment of the present invention.

Referring to FIG. 2, the pixel circuit of the plurality of sub-pixels SP includes first to sixth transistors T1, T2, T3, T4, T5, and T6 and a capacitor Cst.

The first transistor T1 may be connected to a second scan line and be controlled by the second scan signal SCAN2 supplied through the second scan line. In addition, the first transistor T1 may be electrically connected between the data line supplying a data signal Vdata and the capacitor Cst.

When the second scan signal SCAN2 of a turn-on level is applied through the second scan line, the first transistor T1 transfers the data signal Vdata from the data line to the capacitor Cst. The first transistor T1 may be referred to as a switching transistor that controls a timing at which the data signal Vdata is applied to the capacitor Cst.

The second transistor T2 may be electrically connected between the high potential power line to which a high potential power signal EVDD is supplied and the fifth transistor T5. In addition, a gate electrode of the second transistor T2 may be electrically connected to the capacitor Cst. The second transistor T2 may be referred to as a driving transistor that controls luminance of a light emitting element 120 by controlling a current flowing to the light emitting element 120 according to a voltage applied to the gate electrode.

The third transistor T3 may be controlled by the first scan signal SCAN1 supplied through a first scan line. In addition, the third transistor T3 may be electrically connected between the gate electrode and a drain electrode or between the gate electrode and a source electrode of the second transistor T2 according to a type of the third transistor T3.

Meanwhile, the second transistor T2 which is a driving transistor should control the current flowing to the light emitting element 120 according to the data signal Vdata applied to the sub-pixel SP, but a difference in luminance between the light emitting elements 120 disposed in each of the sub-pixels SP may occur due to a difference in threshold voltage of the second transistors T2 disposed in each of the sub-pixels SP.

In this case, the threshold voltage of the second transistor T2 may be compensated by disposing the third transistor T3, and the third transistor T3 may be referred to as a compensation transistor. For example, when the first scan signal SCAN1 for turning on the third transistor T3 is applied, a voltage which is obtained by subtracting the threshold voltage of the second transistor T2 from the high potential power signal EVDD is applied to the gate electrode of the second transistor T2. Then, the data signal Vdata is applied to the capacitor Cst while the high potential power signal EVDD from which the threshold voltage has been subtracted is applied to the gate electrode of the second transistor T2, so that the threshold voltage of the second transistor T2 may be compensated.

Meanwhile, although the third transistor T3 and the first transistor T1 are illustrated as receiving different scan signals SCAN1 and SCAN2 from different scan lines, the third transistor T3 and the first transistor T1 may be connected to the same scan line and receive the same scan signals SCAN1 and SCAN2, but they are not limited thereto.

The fourth transistor T4 may be electrically connected to the initialization signal line to which an initialization signal Vini is supplied, and the capacitor Cst. In addition, the fourth transistor T4 may be controlled by an emission control signal EM which is supplied through the emission control signal line. When the emission control signal EM of a turn-on level is applied through the emission control signal line, the fourth transistor T4 may initialize a voltage of the capacitor Cst or gradually discharge the data signal Vdata applied to the capacitor Cst to allow a current according to the data signal Vdata to flow through the light emitting element 120.

The fifth transistor T5 is electrically connected between the second transistor T2 and the light emitting element 120 and may be controlled by the emission control signal EM which is supplied through the emission control signal line. When the emission control signal EM of the turn-on level is applied in a state in which the data signal Vdata is applied to the capacitor Cst and the high potential power signal EVDD in which the threshold voltage has been compensated is applied to the gate electrode of the second transistor T2, the fifth transistor T5 may be turned on to allow a current to flow through the light emitting element 120.

The sixth transistor T6 is electrically connected between the initialization signal line to which the initialization signal Vini is supplied and an anode of the light emitting element 120, and may be controlled by the first scan signal SCAN1 supplied through the first scan line. When the first scan signal SCAN1 of the turn-on level is applied through the first scan line, the sixth transistor T6 may initialize the anode of the light emitting element 120 or a node between the second transistor T2 and the fifth transistor T5 with the initialization signal Vini.

The capacitor Cst may be a storage capacitor Cst that stores a voltage applied to the gate electrode of the second transistor T2 which is a driving transistor. Here, the capacitor Cst is electrically connected between the gate electrode of the second transistor T2 and the anode of the light emitting element 120. Accordingly, the capacitor Cst may store a difference between a voltage of the gate electrode of the second transistor T2 and a voltage supplied to the anode of the light emitting element 120.

In the present specification, although it is described that the pixel circuit of the plurality of sub-pixels SP includes the first to sixth transistors T1, T2, T3, T4, T5, and T6 and the capacitor Cst, the number of transistors and capacitors may be changed according to design.

Hereinafter, the sub-pixel SP of the display apparatus 100 according to an embodiment of the present invention will be described in more detail with reference to FIGS. 3A and 3B.

Figure 3A:
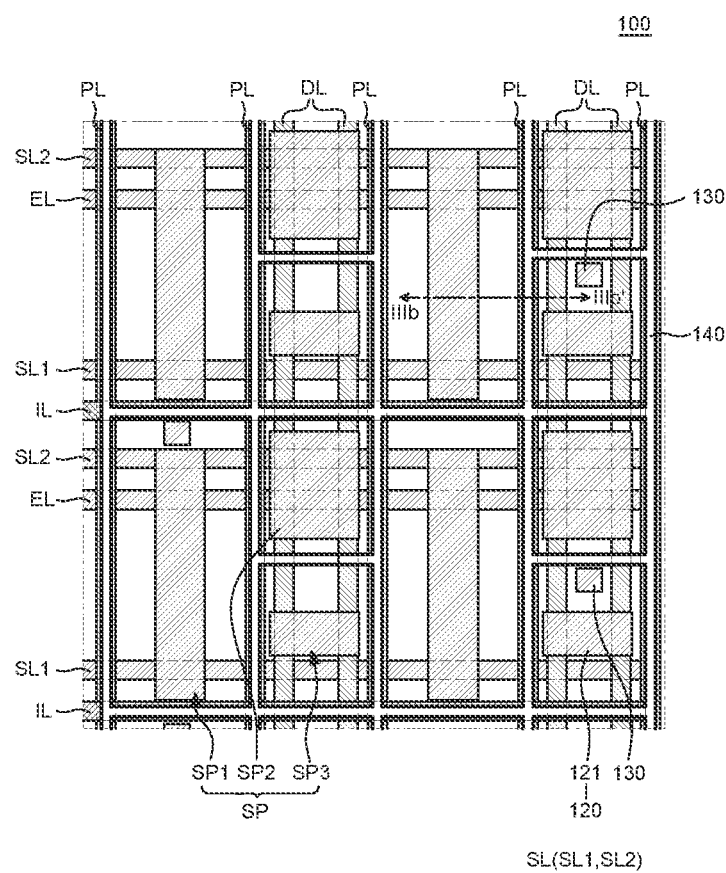
FIG. 3A is an enlarged plan view of the display apparatus according to an embodiment of the present invention.

FIG. 3A is an enlarged plan view of the display apparatus according to an embodiment of the present invention. FIG. 3B is a cross-sectional view taken along IIIb-IIIb' of FIG. 3A. Referring to FIGS. 3A and 3B, the display apparatus 100 according to an embodiment of the present invention includes a substrate 110, a buffer layer 111, a gate insulating layer 112, an interlayer insulating layer 113, a passivation layer 114, a planarization layer 115, a bank 116, high potential power lines PL, a plurality of scan lines SL, data lines DL, initialization signal lines IL, emission control signal lines EL, the fifth transistor T5, the light emitting elements 120, spacers 130, a first pattern 140, and a second pattern 150. In FIG. 3A, for convenience of explanation, the second pattern 150 is not shown, and only an anode 121 among components of the light emitting element 120 is shown. Also, in FIG. 3B, only the fifth transistor T5 among a plurality of the transistors T1, T2, T3, T4, T5, and T6 and the capacitor Cst of the pixel circuit is illustrated for convenience of explanation.

Referring to FIG. 3A, the plurality of sub-pixels SP are individual units that emit light, and the light emitting element 120 is disposed in each of the plurality of sub-pixels SP. The plurality of sub-pixels SP includes first sub-pixels SP1, second sub-pixels SP2, and third sub-pixels SP3 that emit light of different colors. For example, the first sub-pixel SP1 may be a blue sub-pixel, the second sub-pixel SP2 may be a green sub-pixel, and the third sub-pixel SP3 may be a red sub-pixel.

A plurality of the first sub-pixels SP1 may be disposed in a plurality of columns. That is, the plurality of first sub-pixels SP1 may be disposed in the same column. In addition, a plurality of the second sub-pixels SP2 and a plurality of the third sub-pixels SP3 may be disposed between the plurality of respective columns in which the plurality of first sub-pixels SP1 are disposed. For example, the plurality of first sub-pixels SP1 may be disposed in one column, and the second sub-pixels SP2 and the third sub-pixels SP3 may be disposed together in a column adjacent thereto. In addition, the plurality of second sub-pixels SP2 and the plurality of third sub-pixels SP3 may be alternately disposed in the same column. However, in the present specification, although it is described that the plurality of sub-pixels SP include the first sub-pixels SP1, the second sub-pixels SP2, and the third sub-pixels SP3, the arrangement, number, and color combination of the plurality of sub-pixels SP may be variously changed according to design, and are not limited thereto.

The high potential power lines PL that extend in a column direction are disposed between the plurality of sub-pixels SP. A plurality of the high potential power lines PL are lines that transmit the high potential power signal EVDD to each of the plurality of sub-pixels SP. Each of the plurality of high potential power lines PL may be disposed between the first sub-pixel SP1 and the second sub-pixel SP2 and between the first sub-pixel SP1 and the third sub-pixel SP3.

A plurality of the data lines DL that extend in the column direction in the same manner as the plurality of high potential power lines PL are disposed. The plurality of data lines DL are lines that transmit the data signal Vdata to each of the plurality of sub-pixels SP. Each of the plurality of data lines DL may be disposed between the second sub-pixel SP2 and the high potential power line PL and between the third sub-pixel SP3 and the high potential power line PL. However, the plurality of data lines DL may be disposed between the plurality of high potential power lines PL and the first sub-pixels SP1, but are not limited thereto.

The plurality of scan lines SL that extend in a row direction are disposed. The plurality of scan lines SL are lines that transmit scan signals SCAN1 and SCAN2 to each of the plurality of sub-pixels SP. The plurality of scan lines SL include first scan lines SL1 and second scan lines SL2. The first scan line SL1 may be disposed to extend in the row direction between the second sub-pixel SP2 and the third sub-pixel SP3, and the second scan line SL2 may cross the second sub-pixel SP2 and be disposed to extend in the row direction.

A plurality of the initialization signal lines IL that extend in the row direction in the same manner as the plurality of scan lines SL are disposed between the plurality of sub-pixels SP. The plurality of initialization signal lines IL are lines that transmit the initialization signal Vini to each of the plurality of sub-pixels SP. Each of the plurality of initialization signal lines IL may be disposed between the second sub-pixel SP2 and the third sub-pixel SP3. The plurality of initialization signal lines IL may be disposed between the first scan lines SL1 and the second scan lines SL2.

A plurality of the emission control signal lines EL that extend in the row direction in the same manner as the plurality of scan lines SL are disposed. The plurality of emission control signal lines EL are lines that transmit the emission control signal EM to each of the plurality of sub-pixels SP. The plurality of emission control signal lines EL may be disposed to be adjacent to the plurality of second scan lines SL2. The plurality of emission control signal lines EL may be disposed to cross the second sub-pixels SP2 and extend in the row direction. The second scan lines SL2 may be disposed between the plurality of emission control signal lines EL and the plurality of initialization signal lines IL.

Meanwhile, the plurality of lines may be classified into direct current (DC) lines that transmit a DC signal and alternating current (AC) lines that transmit an AC signal. Among the plurality of lines, the high potential power line PL and the initialization signal line IL that transmit the high potential power signal EVDD and the initialization signal Vini, which is DC signals, may be included in the DC lines. Also, among the plurality of lines, the scan line SL and the data line DL that transmit the scan signals SCAN1 and SCAN2 and the data signal Vdata, which are AC signals, may be included in the AC lines.

A plurality of the spacers 130 are disposed between the plurality of sub-pixels SP. When the light emitting elements 120 are formed in the plurality of sub-pixels SP, a fine metal mask (FMM), which is a deposition mask, may be used. In this case, the plurality of spacers 130 may be disposed to prevent damage that may be caused by coming into contact with the deposition mask and to maintain a constant distance between the deposition mask and the substrate 110.

The first pattern 140 is disposed between the plurality of sub-pixels SP.

The first pattern 140 may extend in the column direction and in the row direction between the plurality of sub-pixels SP. For example, the first pattern 140 may extend in the column direction between the first sub-pixel SP1 and the second sub-pixel SP2 or between the first sub-pixel SP1 and the third sub-pixel SP3. In addition, the first pattern 140 may extend in the row direction between the second sub-pixel SP2 and the third sub-pixel SP3 or between the first sub-pixel SP1 and the first sub-pixel SP1.

Referring to FIG. 3A, it is illustrated that a portion of the first pattern 140, extending in the column direction, is disposed to overlap the high potential power line PL, and a portion of the first pattern 140, extending in the row direction, is disposed to overlap the initialization signal line IL which is a DC line, at least in part, but positions at which the first pattern 140 is disposed between the plurality of sub-pixels SP may be variously changed according to design, but are not limited thereto.

Meanwhile, although FIG. 3A illustrates that the first pattern 140 is disposed between all the plurality of sub-pixels SP, the present invention is not limited thereto, and the first pattern 140 may not be disposed between the sub-pixels SP that emit the same color of light among the plurality of sub-pixels SP. For example, the first pattern 140 may not be disposed between the first sub-pixel SP1 and another first sub-pixel SP1 adjacent thereto.

A leakage current from a plurality of light emitting elements 120 can be minimized by the first pattern 140 between the plurality of sub-pixels SP, which will be described in more detail with reference to FIG. 3B.

Figure 3B:
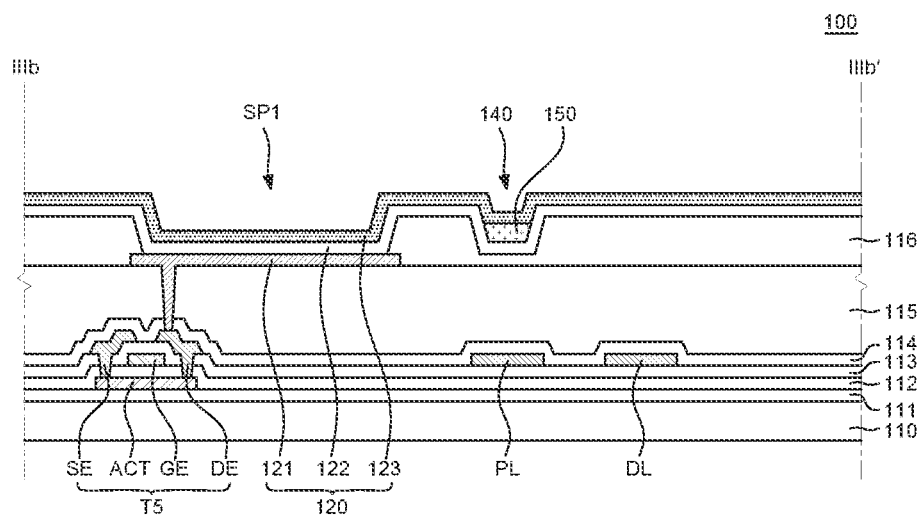
FIG. 3B is a cross-sectional view taken along IIIb-IIIb' of FIG. 3A.

Referring to FIG. 3B, the substrate 110 is a support member for supporting other components of the display apparatus 100, and may be formed of an insulating material. For example, the substrate 110 may be formed of glass or resin or the like. In addition, the substrate 110 may be formed to include a polymer or plastic such as polyimide (PI), or may be formed of a material having flexibility.

The buffer layer 111 is disposed on the substrate 110. The buffer layer 111 may reduce penetration of moisture or impurities through the substrate 110. The buffer layer 111 may be formed of, for example, a single layer or multilayers of silicon oxide (SiOx) or silicon nitride (SiNx), but is not limited thereto. However, the buffer layer 111 may be omitted according to a type of the substrate 110 or a type of the transistor, but is not limited thereto.

The fifth transistor T5 is disposed on the buffer layer 111. The fifth transistor T5 includes an active layer ACT, a gate electrode GE, a source electrode SE, and a drain electrode DE.

The active layer ACT may be formed of a semiconductor material such as an oxide semiconductor, amorphous silicon, or polysilicon, but is not limited thereto. For example, when the active layer ACT is formed of an oxide semiconductor, the active layer ACT may be formed of a channel region, a source region, and a drain region, and the source region and the drain region may be conductive regions, but are not limited thereto.

The gate insulating layer 112 is disposed on the active layer ACT. The gate insulating layer 112 is an insulating layer for insulating the active layer ACT and the gate electrode GE, and may be formed of a single layer or multilayers of silicon oxide (SiOx) or silicon nitride (SiNx), but is limited thereto.

The gate electrode GE is disposed on the gate insulating layer 112. The gate electrode GE may be formed of a conductive material, for example, copper (Cu), aluminum (Al), molybdenum (Mo), nickel (Ni), titanium (Ti), chromium (Cr), or an alloy thereof, but is not limited thereto.

The interlayer insulating layer 113 is disposed on the gate electrode GE. Contact holes for respectively connecting each of the source electrode SE and the drain electrode DE to the active layer ACT are formed in the interlayer insulating layer 113. The interlayer insulating layer 113 may be formed of a single layer or multilayers of silicon oxide (SiOx) or silicon nitride (SiNx), but is not limited thereto.

The source electrode SE and the drain electrode DE are disposed on the interlayer insulating layer 113. The source electrode SE and the drain electrode DE that are disposed to be spaced apart from each other may be electrically connected to the active layer ACT. The source electrode SE and the drain electrode DE may be formed of a conductive material, for example, copper (Cu), aluminum (Al), molybdenum (Mo), nickel (Ni), titanium (Ti), chromium (Cr), or an alloy thereof, but are not limited thereto.

The high potential power line PL and the data line DL are disposed on the interlayer insulating layer 113. The high potential power line PL and the data line DL may be disposed on the same layer and formed of the same conductive material as the source electrode SE and the drain electrode DE, but are not limited thereto. For example, the high potential power line PL and the data line DL may be formed of a conductive material, for example, copper (Cu), aluminum (Al), molybdenum (Mo), nickel (Ni), titanium (Ti), chromium (Cr), or an alloy thereof, but are not limited thereto.

The passivation layer 114 is disposed on the high potential power line PL, the data line DL, the source electrode SE, and the drain electrode DE. The passivation layer 114 is an insulating layer for protecting components under the passivation layer 114. For example, the passivation layer 114 may be formed of a single layer or multilayers of silicon oxide (SiOx) or silicon nitride (SiNx), but is not limited thereto. Also, the passivation layer 114 may be omitted according to embodiments.

The planarization layer 115 is disposed on the passivation layer 114. The planarization layer 115 is an insulating layer that planarizes an upper portion of the substrate 110. The planarization layer 115 may be formed of an organic material, for example, may be formed of a single layer or multilayers of polyimide or photo acryl, but is not limited thereto.

The plurality of light emitting elements 120 are disposed in the plurality of respective sub-pixels SP on the planarization layer 115. The light emitting element 120 includes the anode 121, an organic layer 122, and a cathode 123.

The anode 121 is disposed on the planarization layer 115. The anode 121 may be electrically connected to the transistors of the pixel circuit, for example, the second transistor T2 and the fifth transistor T5 and receive a driving current. Since the anode 121 supplies holes to the organic layer 122, it may be formed of a conductive material having a high work function. The anode 121 may be formed of, for example, a transparent conductive material such as indium tin oxide (ITO) or indium zinc oxide (IZO), but is not limited thereto.

Meanwhile, the display apparatus 100 may be implemented as a top emission type or a bottom emission type. In the case of the top emission type, a reflective layer formed of a metallic material having excellent reflection efficiency, for example, a material such as aluminum (Al) or silver (Ag), may be added under the anode 121 so that light emitted from the organic layer 122 is reflected by the anode 121 and is directed upward, that is, toward the cathode 123. On the other hand, when the display apparatus 100 is the bottom emission type, the anode 121 may be formed of only a transparent conductive material. Hereinafter, it is assumed that the display apparatus 100 according to an embodiment of the present invention is the top emission type.

The bank 116 is disposed on the anode 121 and the planarization layer 115. The bank 116 is an insulating layer disposed between the plurality of sub-pixels SP to separate the plurality of sub-pixels SP. The bank 116 includes an opening that exposes a portion of the anode 121. The bank 116 may be formed of an organic insulating material disposed to cover an end or edge portion of the anode 121. For example, the bank 116 may be formed of polyimide, acryl, or benzocyclobutene (BCB)-based resin, but is not limited thereto.

Referring to FIG. 3A, the spacer 130 is disposed on the bank 116. The spacer 130 is disposed on the bank 116 to maintain a predetermined distance from a deposition mask when the light emitting element 120 is formed. Due to the spacer 130, the bank 116 and the anode 121 under the spacer 130 may maintain a predetermined distance from the deposition mask, and damage due to contact may be prevented. In this case, the plurality of spacers 130 may be formed in a shape in which their widths are narrower upward, for example, a tapered shape, so as to minimize areas in contact with the deposition mask.

The organic layer 122 is disposed on the anode 121, the bank 116, and the spacer 130. The organic layer 122 includes an emission layer and a common layer. The emission layer is an organic layer for emitting light of a specific color, and different emission layers may be disposed in each of the first sub-pixel SP1, the second sub-pixel SP2, and the third sub-pixel SP3, and the same emission layer may be disposed over an entirety of the plurality of sub-pixels SP. For example, when different emission layers are disposed in each of the plurality of sub-pixels SP, a blue emission layer may be disposed in the first sub-pixel SP1, a green emission layer may be disposed in the second sub-pixel SP2, and a red emission layer may be disposed in the third sub-pixel SP3. In addition, the emission layers of the plurality of sub-pixels SP may be connected to each other to form one layer over the plurality of sub-pixels SP. For example, the emission layer may be disposed over all of the plurality of sub-pixels SP, and light from the emission layer may be converted into light of various colors through a separate light conversion layer, a color filter, and the like.

In addition, a plurality of emission layers emitting light of the same color may be stacked in one sub-pixel SP. For example, two blue emission layers are stacked in the first sub-pixel SP1, two green emission layers are stacked in the second sub-pixel SP2, and two red emission layers may be stacked in the third sub-pixel SP3. In this case, a charge generation layer (CGL) may be disposed between the plurality of respective emission layers to thereby smoothly supply electrons or holes to each of the plurality of emission layers. That is, the charge generation layer may be disposed between the two blue emission layers, between the two green emission layers, and between the two red emission layers.

In addition, a plurality of emission layers emitting light of different colors may be stacked in one sub-pixel SP. For example, blue emission layers and yellow-green emission layers may be stacked in all of the plurality of sub-pixels SP to thereby realize white light from all of the plurality of sub-pixels SP. In this case, the charge generation layer may be disposed between the blue emission layer and the yellow-green emission layer.

The common layer is an organic layer disposed to improve luminous efficiency of the emission layer. The common layer may be formed as one layer throughout the plurality of sub-pixels SP. That is, common layers of the plurality of respective sub-pixels SP may be connected to each other and formed integrally. The common layer may include the above-described charge generation layer, a hole injection layer, a hole transport layer, an electron transport layer, an electron injection layer, and the like, but is not limited thereto.

The cathode 123 is disposed on the organic layer 122. Since the cathode 123 supplies electrons to the organic layer 122, it may be formed of a conductive material having a low work function. The cathode 123 may be formed as one layer throughout the plurality of sub-pixels SP. That is, the cathodes 123 of the plurality of respective sub-pixels SP may be connected to each other and formed integrally. The cathode 123 may be formed of, for example, a transparent conductive material such as indium tin oxide (ITO) or indium zinc oxide (IZO), a metal alloy such as MgAg, or an ytterbium (Yb) alloy and may further include a metal doped layer, but is not limited thereto. Meanwhile, the cathode 123 may be electrically connected to the low potential power line and receive a low potential power signal EVSS.

The first pattern 140 is disposed in the bank 116. The first pattern 140 may be a trench formed in the bank 116 between the plurality of sub-pixels SP. The first pattern 140 may be a trench formed in the bank 116. The first pattern 140 may have an uppermost portion or a lowermost portion at a height different from that of an upper surface of the bank 116. The first pattern 140 may have a shape of a trench having a plurality of inclined surfaces extending from the upper surface of the bank 116. However, the first pattern 140 may be formed from the upper surface of the bank 116 to the planarization layer 115 under the bank 116, but is not limited thereto. Also, although the first pattern 140 is illustrated as a trench in FIG. 3B, the first pattern 140 may have various shapes, and is not limited thereto.

The organic layer 122 may have a step due to the first pattern 140. As shown in FIG. 3B, as the first pattern 140 having a trench shape is formed in the bank 116, the organic layer 122 has a difference in height between a portion disposed on the bank 116 other than the first pattern 140 and a portion disposed on the first pattern 140, so that the organic layer 122 may have a step.

The second pattern 150 may be disposed between the organic layer 122 and the cathode 123 so that a step of the cathode 123 is smaller than the step of the organic layer 122. Specifically, the second pattern 150 may be disposed between the organic layer 122 and the cathode 123 in the first pattern 140 disposed in the bank 116. Accordingly, in the first pattern 140, since the cathode 123 is disposed on the organic layer 122, the step of the cathode 123 on the bank 116 may be smaller than the step of the organic layer 122.

The second pattern 150 may be disposed between the plurality of inclined surfaces of the first pattern 140. In this case, the second pattern 150 may be disposed on the bank 116 in a shape corresponding to the first pattern 140. Accordingly, the second pattern 150 may be inserted between the organic layer 122 and the cathode 123 and configured to partially separate the organic layer 122 and the cathode 123 from each other.

A height of an upper surface of the second pattern 150 may be lower than a height of an uppermost portion of the organic layer 122. That is, the second pattern 150 may not completely fill the first pattern 140 of the trench shape, but only fill a portion thereof. Accordingly, the cathode 123 may not be planarized on the bank 116 and may have a step smaller than that of the organic layer 122.

Since the second pattern 150 is disposed between the organic layer 122 and the cathode 123, a leakage current may flow to a region where the second pattern 150 is disposed. Accordingly, the second pattern 150 may have a LUMO (lowest unoccupied molecular orbital) level for preventing injection of electrons from the organic layer 122 adjacent to the second pattern 150, for example, the electron transport layer. Specifically, the LUMO level of the second pattern 150 may be at least 0.3 eV higher than the LUMO level of the electron transport layer.

In addition, the second pattern 150 may be formed of a material having a carrier mobility of $10^{-5}$ cm$^2$/Vs or less. Accordingly, it is difficult for charges to move in the second pattern 150, it is possible to prevent injection of electrons from the electron transport layer, and it is possible to prevent a leakage current from flowing.

Meanwhile, the second pattern 150 may be formed of a material capable of being thermally deposited and having a deposition temperature of 0° C. to 500° C. Accordingly, all processes of depositing the plurality of light emitting elements 120 on the substrate 110 may be performed in the same chamber. Accordingly, compared to a case where the second pattern 150 is formed outside the chamber, such as in a coating process, the light emitting element 120 may not be exposed to the outside of a vacuum chamber during a manufacturing process, and it is possible to prevent an increase in manufacturing cost and manufacturing time.

Specifically, the plurality of light emitting elements 120 may be manufactured by depositing materials constituting respective layers of the light emitting elements 120 on the substrate 110 in a vacuum chamber. At this time, since the second pattern 150 is disposed between the organic layer 122 and the cathode 123 of the light emitting element 120, when the second pattern 150 is formed of a material that cannot be formed by deposition, for example, after taking out the substrate 110 on which the anode 121 and the organic layer 122 are deposited to the outside of the vacuum chamber, the second pattern 150 may be formed by a method such as coating or the like, but at this time, the light emitting element 120 which is exposed to the outside of the vacuum chamber may react with the atmosphere, thereby leading to a degradation in quality. Accordingly, since the second pattern 150 is formed of a material capable of being thermally deposited, all processes of depositing the light emitting elements 120 on the substrate 110 may be performed in the same chamber. Accordingly, since the light emitting element 120 may not be exposed to the outside of the vacuum chamber during the manufacturing process, a degradation in quality of the light emitting element 120 may be prevented.

In addition, when the second pattern 150 is formed by another process such as a coating process, an additional manufacturing apparatus is required, and thus there may be a problem in that a cost and time for manufacturing the plurality of light emitting elements 120 increase. Accordingly, by forming the second pattern 150 together with the plurality of light emitting elements 120 by deposition in the same chamber, it is possible to prevent an additional cost and time for manufacturing the light emitting elements 120 from being consumed.

In this case, the second pattern 150 may be formed of any one material among, for example, an arylenediamine derivative, a triamine derivative, CBP(4,4'-bis(carbazol-9-yl)biphenyl), BCP(2,9-dimethyl-4,7-diphenyl-1,10-phenanthroline), Alq3(tris(8-hydroxyquinolino)aluminum), TPBI(2,2', 2-(1,3,5-benzinetriyl)-tris(1-phenyl-1-H-benzimidazole), PBD(2-(4-biphenyl)-5-(4-tertbutylphenyl)-1,3,4oxadiazole), DTBT (dithienylbenzothiadiazole), pyrazoline, and carbazole.

Referring to FIGS. 3A and 3B, it is illustrated that only one first pattern 140 and one second pattern 150 are disposed on the bank 116, but a plurality of first patterns 140 and a plurality of second patterns 150 may be disposed on the bank 116 and are not limited thereto.

Meanwhile, the common layer of the plurality of light emitting elements 120 is formed as one layer over an entirety of the plurality of sub-pixels SP. In this case, since the light emitting elements 120 of the plurality of sub-pixels SP are formed in a structure in which they share the common layer, when the light emitting element 120 of a specific sub-pixel SP emits light, a phenomenon in which a current flows to the light emitting elements 120 of neighboring sub-pixels SP, that is, a current leakage phenomenon may occur. The current leakage phenomenon may cause the light emitting element 120 of another sub-pixel SP that is not intended, to emit light, which may cause color mixing between the plurality of sub-pixels SP and increase power consumption. In addition, color abnormality and unevenness may be visually recognized due to a leakage current, and thus, display quality may be degraded. For example, when only the first sub-pixel SP1 among the plurality of sub-pixels SP emits light, a portion of a current which is supplied to drive the light emitting element 120 of the first sub-pixel SP1 may leak to the second sub-pixel SP2 and the third sub-pixel SP3 adjacent thereto through the common layer.

In addition, the emission layers disposed separately in each of the plurality of sub-pixels SP have different turn-on voltages. For example, a turn-on voltage for driving the first sub-pixel SP1 in which the blue emission layer is disposed may be highest, and a turn-on voltage for driving the third sub-pixel SP3 in which the red emission layer is disposed may be lowest. In addition, since a barrier through which a current can flow is lower in the second sub-pixel SP2 or the third sub-pixel SP3 having a lower turn-on voltage than the first sub-pixel SP1 having the highest turn-on voltage, a current leaked through the common layer can easily flow from the first sub-pixel SP1 having a high turn-on voltage to the second sub-pixel SP2 and the third sub-pixel SP3 having a low turn-on voltage, and when the first sub-pixel SP1 is driven, the second sub-pixel SP2 and the third sub-pixel SP3 having a low turn-on voltage may emit light together.

In particular, during low grayscale driving, a luminance of light that is emitted from the driven sub-pixel SP is low, so that light emitted from neighboring sub-pixels SP can be more easily recognized. That is, during low grayscale driving, color abnormality and unevenness due to a leakage current can be more easily recognized, and thus display quality can be seriously degraded. In addition, when low grayscale white light is displayed, the third sub-pixel SP3 having the lowest turn-on voltage through the common layer first emits light, so that a reddish phenomenon in which white with red light is displayed instead of pure white may occur.

Accordingly, in the display apparatus 100 according to an embodiment of the present invention, a leakage current through the common layer of the light emitting s 120 can be minimized by disposing a plurality of first patterns 140. First, since the organic layers 122 and the cathodes 123 of the plurality of light emitting elements 120 are disposed on the bank 116 on which the plurality of first patterns 140 are formed, the organic layers 122 and the cathodes 123 may also be disposed on the first patterns 140. Since the organic layers 122 and the cathodes 123 are deposited along the first patterns 140, a length of a path through which the leakage current flows may be increased. Since the common layer of the organic layer 122 which serves as the path of the leakage current is formed along the first pattern 140 and the bank 116, the organic layer 122 has a step, so that a length of the common layer may increase, and the length of the path of the leakage current may increase. Accordingly, a length of the organic layer 122 that is the path through which the leakage current flows, is increased by the first pattern 140 that is the trench, so that resistance of the organic layer 122 can increase and the leakage current flowing to the light emitting elements 120 of adjacent sub-pixels SP can be reduced.

However, the length of the cathode 123 formed along the first pattern 140 may also be increased together with the common layer of the organic layer 122. Accordingly, a problem in which the resistance of the cathode 123 also increases and power consumption increases may occur. Accordingly, in the display apparatus 100 according to an embodiment of the present invention, by disposing the second pattern 150 in the first pattern 140 that is a trench, it is possible to prevent an increase in the resistance of the cathode 123 and an increase in power consumption. Specifically, referring to FIG. 3B, the second pattern 150 may be disposed on a stepped portion formed by the first pattern 140 that is a trench, and may be disposed between the organic layer 122 and the cathode 123. Accordingly, the organic layer 122 may have a step by the first pattern 140 and thus, maintain a state in which the length thereof increases, and the cathode 123 may have a step smaller than that of the organic layer 122 by the second pattern 150. Accordingly, in the display apparatus 100 according to an embodiment of the present invention, by disposing the second pattern 150 in the first pattern 140 that is a trench, a leakage current can be minimized and at the same time, an increase in the resistance of the cathode 123 and an increase in power consumption can be minimized.

Figure 4:
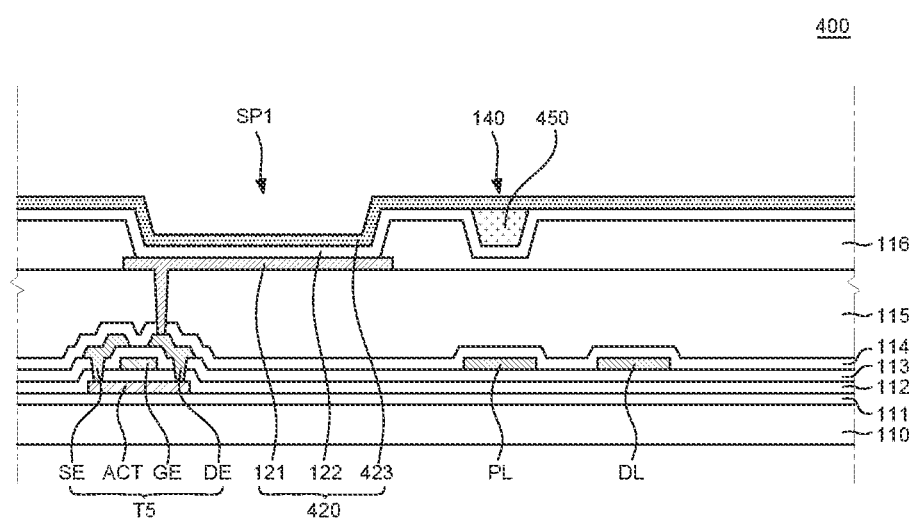
FIG. 4 is a cross-sectional view of a display apparatus according to another embodiment of the present invention.

FIG. 4 is a cross-sectional view of a display apparatus according to another embodiment of the present invention. In FIG. 4, only the fifth transistor T5 among the plurality of transistors T1, T2, T3, T4, T5, and T6 and the capacitor Cst of the pixel circuit is illustrated for convenience of explanation. A display apparatus 400 of FIG. 4 differs from the display apparatus 100 of FIGS. 1 to 3B only in terms of a light emitting element 420 and a second pattern 450, and other configurations thereof are substantially the same and thus, redundant descriptions thereof will be omitted.

Referring to FIG. 4, in the display apparatus 400 according to another embodiment of the present invention, a height of an upper surface of the second pattern 450 disposed in the first pattern 140 which is a trench may be equal to a height of the uppermost portion of the organic layer 122. That is, the second pattern 450 may completely fill the first pattern 140 of the trench shape. Accordingly, the cathode 423 on the bank 116 may be planarized and may have a flat shape without a step.

In the display apparatus 400 according to another embodiment of the present invention, by disposing the first pattern 140 on the bank 116, a leakage current through the common layer of the light emitting element 420 can be minimized, and by disposing the second pattern 450 in the first pattern 140, it is possible to prevent an increase in the resistance of the cathode 423 and an increase in power consumption. Specifically, referring to FIG. 4, the second pattern 450 may be disposed in a stepped portion formed by the first pattern 140 that is a trench, and may be disposed between the organic layer 122 and the cathode 423. Accordingly, the organic layer 122 may have a step by the first pattern 140 and thus, maintain a state in which the length thereof increases, while the cathode 423 can have a flat shape without a step, because the step of the organic layer 122 is canceled by the second pattern 450. Accordingly, in the display apparatus 400 according to another embodiment of the present invention, the second pattern 450 is disposed in the first pattern 140 that is a trench, so that the leakage current can be minimized and at the same time, increases in the resistance of the cathode 423 and power consumption can be minimized.

Figure 5A:
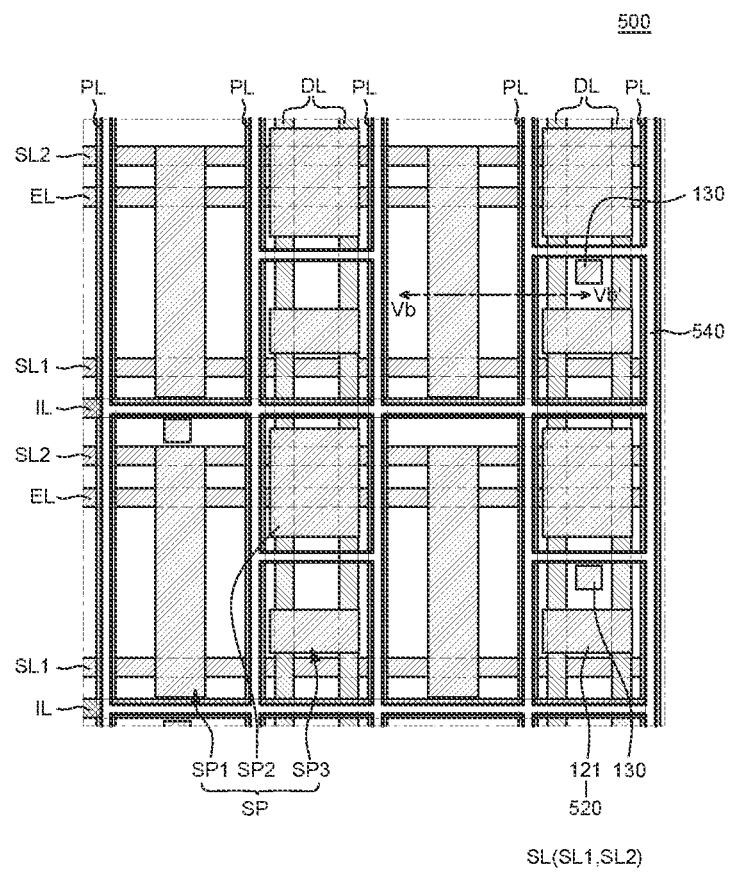
FIG. 5A is an enlarged plan view of a display apparatus according to still another embodiment of the present invention.
Figure 5B:
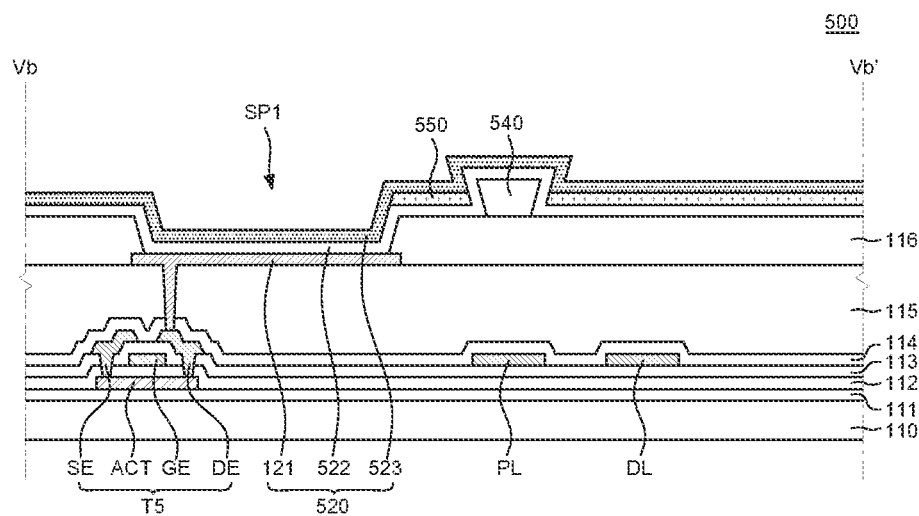
FIG. 5B is a cross-sectional view taken along Vb-Vb' of FIG. 5A.

FIG. 5A is an enlarged plan view of a display apparatus according to still another embodiment of the present invention. FIG. 5B is a cross-sectional view taken along Vb-Vb' of FIG. 5A. In FIG. 5A, a second pattern 550 is not shown for convenience of explanation, and only the anode 121 among the components of a light emitting element 520 is shown. In FIG. 5B, only the fifth transistor T5 among the plurality of transistors T1, T2, T3, T4, T5, and T6 and the capacitor Cst of the pixel circuit is illustrated for convenience of explanation. A display apparatus 500 of FIGS. 5A and 5B differs from the display apparatus 100 of FIGS. 1 to 3B only in terms of the light emitting element 520, a first pattern 540, and a second pattern 550 and other configurations thereof are substantially the same, and thus, redundant descriptions thereof will be omitted.

Referring to FIGS. 5A and 5B, the first pattern 540 may have a reverse-tapered shape disposed on the bank 116. That is, the first pattern 540 is disposed on the bank 116, and may have a reverse-tapered shape in which a lower surface is smaller than an upper surface.

In addition, the second pattern 550 may be disposed on the bank 116 to surround the first pattern 540. That is, the second pattern 550 may be disposed on the bank 116 in a shape corresponding to a side shape of the first pattern 540.

Accordingly, an organic layer 522 which is formed along the first pattern 540 may have a step, resistance of the organic layer 522 increases, and the leakage current flowing to the light emitting elements 520 of adjacent sub-pixels SP can be reduced.

Specifically, since the organic layers 522 and the cathodes 523 of a plurality of light emitting elements 520 are disposed on the bank 116 on which the first pattern 540 is formed, the organic layer 522 and the cathode 523 may also be disposed on the first pattern 540. Since the organic layer 522 and the cathode 523 are deposited along the first pattern 540, the length of the path through which the leakage current flows may increase. Since the common layer of the organic layer 522 serving as the path of the leakage current is formed along the first pattern 540 and the bank 116, the organic layer 522 has a step, so that the length of the common layer can increase, and the length of the path of the leakage current may increase. Accordingly, a length of the organic layer 522 that is a path through which the leakage current flows is increased by the first pattern 540 having a reverse-tapered shape disposed on the bank 116, so that the resistance of the organic layer 522 may increase. Accordingly, the leakage current flowing to the light emitting elements 520 of adjacent sub-pixels SP may be reduced.

Meanwhile, when the organic layer 522 is formed on the first pattern 540 having a reverse-tapered shape, it may be difficult to deposit the organic layer 522 on a lower portion of the first pattern 540 due to a shadow effect. Therefore, since the lower portion of the first pattern 540 is covered by an upper portion of the first pattern 540 which is relatively wide, it is difficult for the organic layer 522 to be deposited on the lower portion of the first pattern 540, the organic layer 522 may have a small thickness or may be disconnected in the first pattern 540. Accordingly, the resistance of the organic layer 522 may be increased as the organic layer 522 is close to a plurality of first patterns 540, and the leakage current flowing to the light emitting elements 520 of adjacent sub-pixels SP may be reduced.

Referring to FIG. 5B, the second pattern 550 may be disposed on the bank 116 to surround the first pattern 540. That is, the second pattern 550 may be disposed on the bank 116 in a shape corresponding to the side shape of the first pattern 540. The second pattern 550 may be disposed between the organic layer 522 and the cathode 523 on the bank 116. Accordingly, since the cathode 523 is disposed on the second pattern 550 on the bank 116, a step of the cathode 523 on the bank 116 may be smaller than a step of the organic layer 522.

A height of an upper surface of the second pattern 550 may be lower than a height of an uppermost portion of the organic layer 522. That is, the second pattern 550 may be disposed so as not to completely surround a side surface of the first pattern 540 having a reverse-tapered shape on the bank 116, but to surround only a part thereof. Accordingly, on the bank 116, the cathode 523 may not be planarized and may have a step smaller than that of the organic layer 522.

In the display apparatus 500 according to still another embodiment of the present invention, by disposing the first pattern 540 on the bank 116, the leakage current through the common layer of the light emitting element 520 can be minimized, and by disposing the second pattern 550 to surround the first pattern 540 having a reverse-tapered shape, it is possible to prevent an increase in the resistance of the cathode 523 and an increase in power consumption. Specifically, referring to FIGS. 5A and 5B, the second pattern 550 may be disposed to surround the first pattern 540 having a reverse-tapered shape, and disposed between the organic layer 522 and the cathode 523. Accordingly, the organic layer 522 may have a step by the first pattern 540 and thus, maintain a state in which the length thereof increases, and the cathode 523 may have a step smaller than that of the organic layer 522 by the second pattern 550. Accordingly, in the display apparatus 500 according to an embodiment of the present invention, the second pattern 550 is disposed to surround the first pattern 540 having a reverse-tapered shape, so that it is possible to minimize the leakage current and at the same time to minimize an increase in resistance of the cathode 523 and an increase in power consumption.

Figure 6:
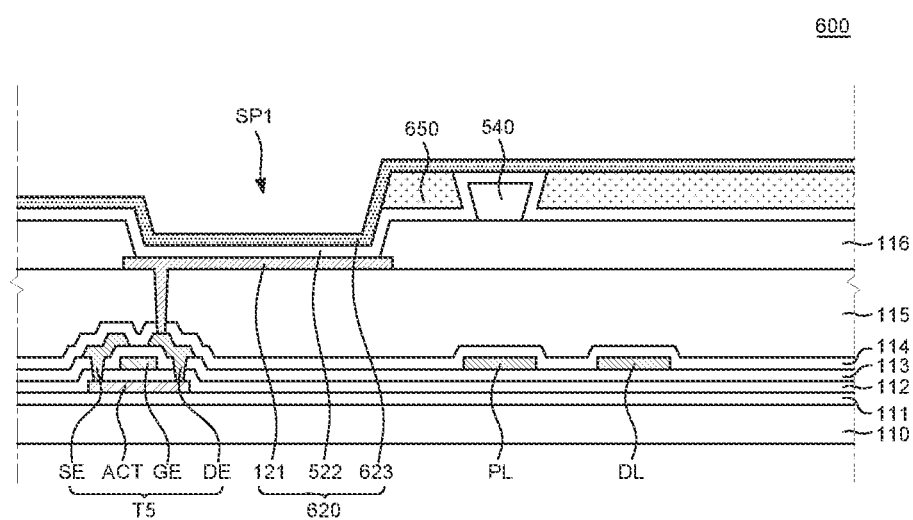
FIG. 6 is a cross-sectional view of a display apparatus according to still another embodiment of the present invention.

FIG. 6 is a cross-sectional view of a display apparatus according to still another embodiment of the present invention. In FIG. 6, only the fifth transistor T5 among the plurality of transistors T1, T2, T3, T4, T5, and T6 and the capacitor Cst of the pixel circuit is illustrated for convenience of explanation. A display apparatus 600 of FIG. 6 differs from the display apparatus 500 of FIGS. 5A and 5B only in terms of a cathode 623 and a second pattern 650 and other configurations thereof are substantially the same, and thus, redundant descriptions thereof will be omitted.

Referring to FIG. 6, in the display apparatus 600 according to still another embodiment of the present invention, a height of an upper surface of the second pattern 650 that surrounds the first pattern 540 having a reverse-tapered shape may be equal to a height of an uppermost portion of the organic layer 522. That is, the second pattern 650 may be disposed on the bank 116 to completely surround the side surface of the first pattern 540 having a reverse-tapered shape. Accordingly, the cathode 623 on the bank 116 may be planarized and may have a flat shape without a step.

Accordingly, in the display apparatus 600 according to still another embodiment of the present invention, a leakage current through a common layer of a light emitting element 620 can be minimized by disposing the first pattern 540 on the bank 116, and it is possible to prevent an increase in resistance of the cathode 623 and an increase in power consumption by disposing the second pattern 650 to surround the first pattern 540 having a reverse-tapered shape. Specifically, referring to FIG. 6, the second pattern 650 may be disposed to surround the first pattern 540 having a reverse-tapered shape, and may be disposed between the organic layer 522 and the cathode 623. Accordingly, the organic layer 522 has a step by the first pattern 540 and maintains a state in which a length thereof increases, while the cathode 623 may have a flat shape without a step, because the step of the organic layer 522 is canceled by the second pattern 650. Accordingly, in the display apparatus 600 according to still another embodiment of the present invention, the second pattern 650 is disposed to surround the first pattern 540 having a reverse-tapered shape, so that a leakage current can be minimized and at the same time, an increase in the resistance of the cathode 623 and an increase in power consumption can be minimized.

Figure 7:
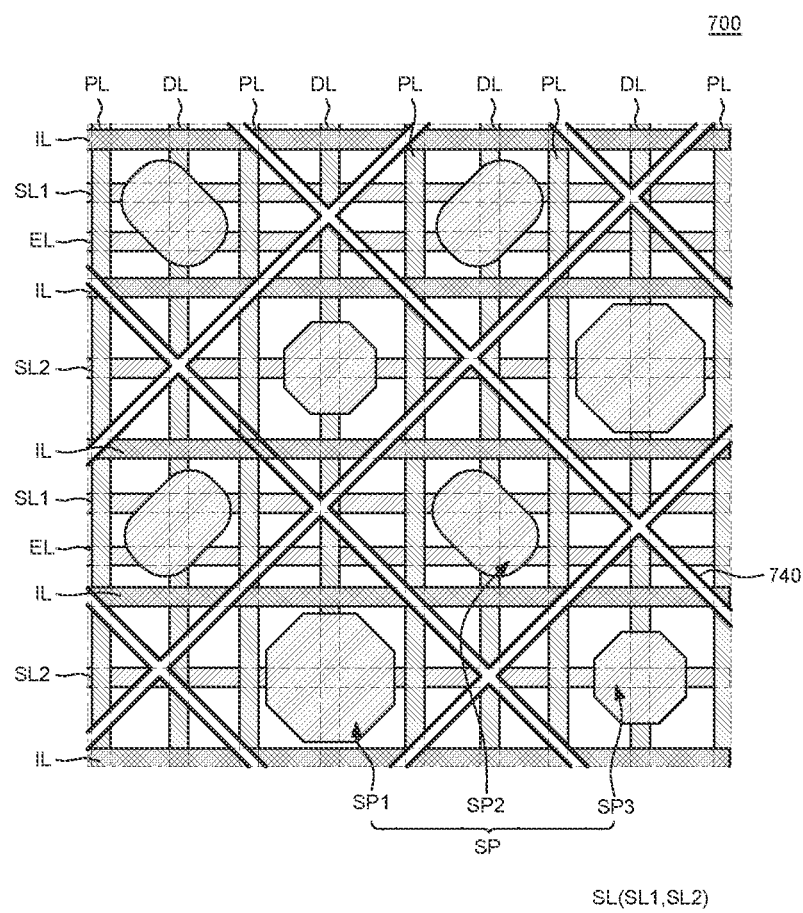
FIG. 7 is an enlarged plan view of a display apparatus according to yet another embodiment of the present invention.

FIG. 7 is an enlarged plan view of a display apparatus according to yet another embodiment of the present invention. In FIG. 7, a second pattern is not illustrated for convenience of explanation. A display apparatus 700 of FIG. 7 differs from the display apparatus 100 of FIGS. 1 to 3B only in terms of the plurality of sub-pixels SP, a plurality of lines, and a first pattern 740 and other configurations thereof are substantially the same, and thus, redundant descriptions thereof will be omitted.

Referring to FIG. 7, the plurality of sub-pixels SP include first sub-pixels SP1, second sub-pixels SP2, and third sub-pixels SP3.

A plurality of the first sub-pixels SP1 and a plurality of the third sub-pixels SP3 may be alternately disposed in the same column or in the same row. For example, the first sub-pixels SP1 and the third sub-pixels SP3 may be alternately disposed in the same column, and the first sub-pixels SP1 and the third sub-pixels SP3 may be alternately disposed in the same row.

A plurality of the second sub-pixels SP2 are disposed in columns and rows that are different from those of the plurality of first sub-pixels SP1 and the plurality of third sub-pixels SP3. For example, the plurality of second sub-pixels SP2 may be disposed in one row, and the plurality of first sub-pixels SP1 and the plurality of third sub-pixels SP3 may be alternately disposed in a row adjacent to the one row. The plurality of second sub-pixels SP2 may be disposed in one column, and the plurality of first sub-pixels SP1 and the plurality of third sub-pixels SP3 may be alternately disposed in a column adjacent to the one column. The plurality of first sub-pixels SP1 and the second sub-pixels SP2 may face each other in a diagonal direction, and the plurality of third sub-pixels SP3 and the second sub-pixels SP2 may also face each other in a diagonal direction. Accordingly, the plurality of sub-pixels SP may be disposed in a grid shape.

However, in FIG. 7, it is illustrated that the plurality of first sub-pixels SP1 and the plurality of third sub-pixels SP3 are disposed in the same column and in the same row, and the plurality of second sub-pixels SP2 are disposed in columns and rows that are different from those of the plurality of first sub-pixels SP1 and the plurality of third sub-pixels SP3, but an arrangement of the plurality of sub-pixels SP is not limited thereto.

A plurality of high potential power lines PL that extend in the column direction are disposed between the plurality of respective sub-pixels SP. The high potential power line PL may be disposed between a column in which the plurality of second sub-pixels SP2 are disposed and a column in which the plurality of first sub-pixels SP1 and the plurality of third sub-pixels SP3 are disposed. For example, the high potential power lines PL may be disposed on both sides of the plurality of second sub-pixels SP2, and on both sides of the plurality of first sub-pixels SP1 and the plurality of third sub-pixels SP3.

A plurality of data lines DL that extend in the column direction are disposed between the plurality of respective high potential power lines PL. That is, the plurality of high potential power lines PL and the plurality of data lines DL may be alternately disposed. A portion of the plurality of data lines DL may be disposed to overlap the plurality of second sub-pixels SP2 disposed in the same column, and another portion of the plurality of data lines DL may be disposed to overlap the plurality of first sub-pixels SP1 and the plurality of third sub-pixels SP3 disposed in the same column.

A plurality of initialization signal lines IL that extend in the row direction are disposed between the plurality of respective sub-pixels SP. The initialization signal line IL may be disposed between a row in which the plurality of second sub-pixels SP2 are disposed and a row in which the plurality of first sub-pixels SP1 and the plurality of third sub-pixels SP3 are disposed. For example, the initialization signal lines IL may be disposed on both sides of the plurality of second sub-pixels SP2 and on both sides of the plurality of first sub-pixels SP1 and the plurality of third sub-pixels SP3.

A plurality of scan lines SL and a plurality of emission control signal lines EL that extend in the row direction are disposed between the plurality of respective initialization signal lines IL. For example, first scan lines SL1 among the plurality of scan lines SL may be disposed to overlap the plurality of second sub-pixels SP2, and second scan lines SL2 among the plurality of scan lines SL may be disposed to overlap the plurality of first sub-pixels SP1 and the plurality of third sub-pixels SP3. In addition, each of the plurality of emission control signal lines EL may be disposed to be adjacent to the first scan line SL1 and overlap each of the second sub-pixels SP2. However, in FIG. 13, it is illustrated that a portion of the plurality of lines are disposed between the plurality of sub-pixels SP and another portion of the plurality of lines overlap the plurality of sub-pixels SP, but an arrangement of the plurality of lines is not limited thereto.

The first pattern 740 is disposed between the plurality of sub-pixels SP. On a plane, the first pattern 740 may be disposed between the plurality of respective sub-pixels SP, and may be disposed to correspond to a shape in which the plurality of sub-pixels SP are disposed, for example, in a grid shape.

The first pattern 740 may extend in a diagonal direction between the plurality of sub-pixels SP. The first pattern 740 may have two diagonal lines that extend in different directions, the two diagonal lines intersect each other, and may be disposed between the plurality of sub-pixels SP. However, the present invention is not limited thereto, and the first pattern 740 may extend in a vertical direction or a horizontal direction.

The first pattern 740 may be disposed on a bank between the plurality of sub-pixels SP, and may form a step in the organic layer disposed on the bank. Accordingly, a path of the organic layer may be increased, and leakage of a current from the sub-pixel SP to another adjacent sub-pixel SP along the organic layer may be minimized.

In addition, a second pattern may be further disposed on the bank between the plurality of sub-pixels SP to reduce a step of a cathode due to the first pattern 740. The second pattern may be disposed on the bank between the plurality of sub-pixels SP and disposed between the organic layer and the cathode. Accordingly, it may be disposed to alleviate the step of the cathode due to the first pattern 740.

In a display apparatus 700 according to yet another embodiment of the present invention, the first pattern 740 and the second pattern are disposed between the plurality of respective sub-pixels SP that are disposed in a grid shape, so that a flowing of a leakage current can be minimized and at the same time, it is possible to minimize an increase in resistance of the cathode and an increase in power consumption. The first sub-pixels SP1 and the third sub-pixels SP3 among the plurality of sub-pixels SP may be alternately disposed in the same row and the same column. In addition, the plurality of second sub-pixels SP2 may be disposed in rows and columns that are different from those of the first sub-pixels SP3. Accordingly, the plurality of first sub-pixels SP1, the plurality of second sub-pixels SP2, and the plurality of third sub-pixels SP3 may be disposed in a grid shape. In this case, the first pattern 740 and the second pattern may be disposed between the first sub-pixels SP1, the second sub-pixels SP2, and the third sub-pixels SP3, thereby minimizing a transmission of the leakage current to the sub-pixels SP that are not intended when a display apparatus 700 is driven, and at the same time, minimizing an increase in power consumption of the display apparatus 700. The first pattern 740 may minimize transmission of the leakage current in such a manner as to increase a length of the organic layer, which is a path through which the leakage current flows, and the second pattern may be disposed between the organic layer and the cathode, thereby minimizing an increase in length of the cathode by the first pattern 740. Accordingly, in the display apparatus 700 according to yet another embodiment of the present invention, the first pattern 740 and the second pattern are disposed between the plurality of respective sub-pixels SP that are disposed in a grid shape, so that it is possible to minimize a leakage current flowing to adjacent sub-pixels SP and at the same time, an increase in resistance of the cathode and an increase in power consumption.

The exemplary embodiments of the present disclosure can also be described as follows:

According to an aspect of the present disclosure, a display apparatus according to an embodiment of the present invention may include a substrate; a plurality of sub-pixels disposed on the substrate; a plurality of anodes disposed in the plurality of sub-pixels; a bank disposed to cover ends of the plurality of anodes; an organic layer disposed on the plurality of anodes and the bank; a cathode disposed on the organic layer; a first pattern disposed in the bank or on the bank so that the organic layer has a step; and a second pattern disposed between the organic layer and the cathode so that a step of the cathode is smaller than the step of the organic layer.

The first pattern may be a trench disposed in the bank, and the second pattern may be disposed in the trench.

A height of an upper surface of the second pattern may be lower than a height of an uppermost portion of the organic layer.

A height of an upper surface of the second pattern may be equal to a height of an uppermost portion of the organic layer.

The first pattern may have a reverse-tapered shape disposed on the bank, and the second pattern may be disposed on the bank to surround the first pattern.

A height of an upper surface of the second pattern may be lower than a height of an uppermost portion of the organic layer.

A height of an upper surface of the second pattern may be equal to a height of an uppermost portion of the organic layer.

A deposition temperature of a material forming the second pattern may be 0° C. to 500° C.

The organic layer may include an electron transport layer, wherein a LUMO level of the second pattern may be 0.3 eV or more higher than a LUMO level of the electron transport layer.

A carrier mobility of the second pattern may be $10^{-5}$ cm$^2$/Vs or less.

The second pattern may be able to be formed of any one material among an arylenediamine derivative, a triamine derivative, CBP(4,4'-bis(carbazol-9-yl)biphenyl), BCP(2,9-dimethyl-4,7-diphenyl-1,10-phenanthroline), Alq3(tris(8-hydroxyquinolino)aluminum), TPBI(2,2',2-(1,3,5-benzinetriyl)-tris(1-phenyl-1-H-benzimidazole), PBD(2-(4-biphenyl)-5-(4-tertbutylphenyl)-1,3,4oxadiazole), DTBT (dithienylbenzothiadiazole), pyrazoline, and carbazole.

A display apparatus according to another embodiment of the present invention may include a substrate on which a plurality of sub-pixels are disposed; a plurality of light emitting elements disposed in the plurality of sub-pixels and including an anode, an organic layer, and a cathode; a bank disposed between the plurality of sub-pixels; a first pattern disposed in the bank or on the bank and having an uppermost portion or a lowermost portion at a height different from that of an upper surface of the bank; and a second pattern disposed on the bank in a shape corresponding to the first pattern, wherein the organic layer and the cathode are disposed on the first pattern, and the second pattern is inserted between the organic layer and the cathode and configured to partially separate the organic layer and the cathode from each other.

The first pattern may have a shape of a trench having a plurality of inclined surfaces extending from the upper surface of the bank, and the second pattern may be disposed between the plurality of inclined surfaces.

The first pattern may be disposed on the bank and may have a reverse-tapered shape in which a lower surface is smaller than an upper surface, and the second pattern may be disposed on the bank in a shape corresponding to a side shape of the first pattern.

An upper surface of the second pattern may be lower than an uppermost portion of the organic layer.

An upper surface of the second pattern may be disposed at a height equal to that of an uppermost portion of the organic layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display apparatus comprising:
a plurality of sub-pixels disposed on a substrate;
a plurality of anodes disposed in the plurality of sub-pixels;
a bank disposed to cover ends of the plurality of anodes;
an organic layer disposed on the plurality of anodes and the bank;
a cathode disposed on the organic layer;
a first pattern disposed in the bank or on the bank so that the organic layer has a step; and
a second pattern disposed between the organic layer and the cathode so that a step of the cathode is smaller than the step of the organic layer.

2. The display apparatus of claim 1, wherein the first pattern is a trench disposed in the bank, and
the second pattern is disposed in the trench.

3. The display apparatus of claim 2, wherein a height of an upper surface of the second pattern is lower than a height of an uppermost portion of the organic layer.

4. The display apparatus of claim 2, wherein a height of an upper surface of the second pattern is equal to a height of an uppermost portion of the organic layer.

5. The display apparatus of claim 1, wherein the first pattern has a reverse-tapered shape disposed on the bank, and
the second pattern is disposed on the bank to surround the first pattern.

6. The display apparatus of claim 5, wherein a height of an upper surface of the second pattern is lower than a height of an uppermost portion of the organic layer.

7. The display apparatus of claim 5, wherein a height of an upper surface of the second pattern is equal to a height of an uppermost portion of the organic layer.

8. The display apparatus of claim 1, wherein a deposition temperature of a material forming the second pattern is about 0° C. to 500° C.

9. The display apparatus of claim 1, wherein the organic layer includes an electron transport layer, and
wherein a lowest unoccupied molecular orbital (LUMO) level of the second pattern is about 0.3 eV or more higher than a LUMO level of the electron transport layer.

10. The display apparatus of claim 1, wherein a carrier mobility of the second pattern is about $10^{-5}$ cm$^2$/Vs or less.

11. The display apparatus of claim 1, wherein the second pattern is formed of any one material among an arylenediamine derivative, a triamine derivative, CBP(4,4'-bis(carbazol-9-yl)biphenyl), BCP(2,9-dimethyl-4,7-diphenyl-1,10-phenanthroline), Alq3(tris(8-hydroxyquinolino)aluminum), TPBI(2,2',2-(1,3,5-benzinetriyl)-tris(1-phenyl-1-H-benzimidazole), PBD(2-(4-biphenyl)-5-(4-tertbutylphenyl)-1,3,4-oxadiazole), DTBT (dithienylbenzothiadiazole), pyrazoline, and carbazole.

12. A display apparatus comprising:
a plurality of sub-pixels disposed on a substrate;
a plurality of light emitting elements disposed in the plurality of sub-pixels, and including an anode, an organic layer, and a cathode;
a bank disposed between the plurality of sub-pixels;
a first pattern disposed in the bank or on the bank and having an uppermost portion or a lowermost portion at a height different from a height of an upper surface of the bank; and
a second pattern disposed on the bank in a shape corresponding to the first pattern,
wherein the organic layer and the cathode are disposed on the first pattern,
wherein the second pattern is inserted between the organic layer and the cathode, and configured to partially separate the organic layer and the cathode from each other.

13. The display apparatus of claim 12, wherein the first pattern has a shape of a trench having a plurality of inclined surfaces extending from the upper surface of the bank, and
wherein the second pattern is disposed between the plurality of inclined surfaces.

14. The display apparatus of claim 12, wherein the first pattern is disposed on the bank and has a reverse-tapered shape in which a lower surface is smaller than an upper surface, and
the second pattern is disposed on the bank in a shape corresponding to a side shape of the first pattern.

15. The display apparatus of claim 12, wherein an upper surface of the second pattern is lower than an uppermost portion of the organic layer.

16. The display apparatus of claim 12, wherein an upper surface of the second pattern is disposed at a height equal to a height of an uppermost portion of the organic layer.

17. The display apparatus of claim 1, wherein a height of the step of the cathode is smaller than a height of the step of the organic layer.

* * * * *